(12) United States Patent
Borthakur et al.

(10) Patent No.: US 8,048,708 B2
(45) Date of Patent: Nov. 1, 2011

(54) METHOD AND APPARATUS PROVIDING AN IMAGER MODULE WITH A PERMANENT CARRIER

(75) Inventors: Swarnal Borthakur, Boise, ID (US); Rick Lake, Meridian, ID (US); Andy Perkins, Boise, ID (US); Scott Churchwell, Boise, ID (US); Steve Oliver, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 358 days.

(21) Appl. No.: 12/213,836

(22) Filed: Jun. 25, 2008

(65) Prior Publication Data

US 2009/0321863 A1 Dec. 31, 2009

(51) Int. Cl.
*H01L 21/00* (2006.01)
(52) U.S. Cl. .............. 438/64; 257/433; 257/E21.499
(58) Field of Classification Search ............ 438/64, 438/65, 70; 257/432, 433, E21.499, E31.11
See application file for complete search history.

(56) References Cited

U.S. PATENT DOCUMENTS

| | | | |
|---|---|---|---|
| 6,593,607 B1 | 7/2003 | Hseih | |
| 7,031,083 B2 | 4/2006 | Chen | |
| 7,061,106 B2 | 6/2006 | Yang et al. | |
| 2002/0005531 A1 | 1/2002 | Levy | |
| 2005/0030403 A1 | 2/2005 | Yaung et al. | |
| 2005/0173811 A1 | 8/2005 | Kinsman | |
| 2005/0212132 A1 | 9/2005 | Hsuan et al. | |
| 2005/0230720 A1 | 10/2005 | Miyagawa et al. | |
| 2006/0035415 A1 | 2/2006 | Wood et al. | |
| 2006/0097133 A1 | 5/2006 | Yaung | |
| 2006/0131710 A1 | 6/2006 | Kuo et al. | |
| 2006/0192230 A1 | 8/2006 | Wood et al. | |
| 2006/0205119 A1 | 9/2006 | Appelt et al. | |
| 2006/0263926 A1 | 11/2006 | Ford | |
| 2006/0274189 A1 | 12/2006 | Mouli | |
| 2006/0284057 A1 | 12/2006 | Park | |
| 2007/0019952 A1 | 1/2007 | Fujimori | |
| 2007/0029469 A1 | 2/2007 | Rhodes | |
| 2007/0045875 A1 | 3/2007 | Farnworth et al. | |
| 2007/0048902 A1 | 3/2007 | Hiatt et al. | |
| 2007/0108579 A1 | 5/2007 | Bolken et al. | |
| 2007/0117253 A1 | 5/2007 | Hsu et al. | |
| 2007/0126081 A1 | 6/2007 | Webster et al. | |
| 2007/0126916 A1 | 6/2007 | Webster et al. | |
| 2007/0138644 A1 | 6/2007 | McWilliams et al. | |
| 2007/0148846 A1 | 6/2007 | Hyun | |
| 2007/0152148 A1 | 7/2007 | Chao et al. | |
| 2007/0170349 A1 | 7/2007 | Mouli | |

(Continued)

FOREIGN PATENT DOCUMENTS

CN 1905140 1/2007

(Continued)

OTHER PUBLICATIONS

El Gamal, Abbas et al., "CMOS Imgae Sensors", IEEE Circuits & Devices Magazine, vol. 21, Issue 3, pp. 6-20, May-Jun. 2005.

(Continued)

*Primary Examiner* — Matthew Landau
*Assistant Examiner* — Sonya D McCall Shepard
(74) *Attorney, Agent, or Firm* — Dickstein Shapiro LLP

(57) ABSTRACT

Method and apparatus providing a wafer level fabrication of imager modules in which a permanent carrier protects imager devices on an imager wafer and is used to support a lens wafer.

27 Claims, 22 Drawing Sheets

U.S. PATENT DOCUMENTS

| | | |
|---|---|---|
| 2007/0176086 A1 | 8/2007 | Hiltunen |
| 2007/0196948 A1 | 8/2007 | Trezza |
| 2008/0009102 A1 | 1/2008 | Yang et al. |
| 2008/0018662 A1 | 1/2008 | Gazeley |
| 2008/0023545 A1 | 1/2008 | Feng et al. |
| 2008/0023809 A1 | 1/2008 | Wu et al. |
| 2008/0026583 A1 | 1/2008 | Hardy et al. |
| 2008/0029879 A1 | 2/2008 | Tuckerman et al. |
| 2008/0122055 A1 | 5/2008 | Perkins et al. |

FOREIGN PATENT DOCUMENTS

| | | |
|---|---|---|
| CN | 1967852 | 5/2007 |
| CN | 101005091 | 7/2007 |
| EP | 1 389 804 A2 | 2/2004 |
| JP | 2007-150283 | 6/2007 |
| KR | 20030097524 | 12/2003 |
| KR | 20040058691 | 7/2004 |
| TW | 236074 B | 7/2005 |
| TW | 236768 B | 7/2005 |
| TW | 250625 B | 3/2006 |
| TW | 254460 B | 5/2006 |
| TW | 280648 B | 5/2007 |
| TW | 280658 B | 5/2007 |
| WO | WO 2006/089447 A1 | 8/2006 |
| WO | WO 2007/103213 A1 | 9/2007 |
| WO | WO 2007/149137 A1 | 12/2007 |

OTHER PUBLICATIONS

Chowdhury, Asif et al., "Challenges of Megapixel Camera Module Assembly and Test", 2005 Electronic Components and Technology Conference, vol. 2, pp. 1390-1401, May 31-Jun. 3, 2005.

Brouk, Igor et al., "Design and Characterization of CMOS/SOI Image Sensors", IEEE Transactions on Electron Devices, vol. 54, No. 3, pp. 468-475, Mar. 2007.

Lin, Chi-Shao et al., "Analytical Charge Collection and MTF Model for Photodiode-Based CMOS Imagers", IEEE Transactions on Electron Devices, vol. 49, No. 5, pp. 754-761, May 2002.

Joy, Tom et al., "Development of a Production-Ready, Back-Illuminated CMOS Image Sensor with Small Pixels", IEEE International Electron Devices Meeting, pp. 1007-1010, Dec. 10-12, 2007.

Banerjee, Kaustav et al., "3-D ICs: A Novel Chip Design for Improving Deep-Submicrometer Interconnect Performance and Systems-on-Chip Integration", Proceedings of the IEEE, vol. 89, No. 5, pp. 602-633, May 2001.

Al-sarawi, Said et al., "A Review of 3-D Packaging Technology", IEEE Transactions on Components, Packaging, and Manufacturing Technology—Part B, vol. 21, No. 1, pp. 2-14, Feb. 1998.

Sharifi, Hasan et al., "Self-Aligned Wafer-Level Integration Technology with High-Density Interconnects and Embedded Passives", IEEE Transaction on Advanced Packaging, vol. 30, No. 1, pp. 11-18, Feb. 2007.

Chong, Desmond et al., "Development of a New Improved high Performance Flip chip BGA Package", 2004 Electronic Components and Technology Conference, vol. 2, pp. 11-18, Jun. 1-4, 2004.

de Jong, E.C.W. et al., "3D Integration with PCB Technology", IEEE Applied Power Electronics Conference and Exposition, pp. 857-863, Mar. 19-23, 2006.

TOP DOWN VIEWS　　　　　SIDE VIEWS

TOP DOWN VIEWS　　　　　SIDE VIEWS

METHOD AND APPARATUS PROVIDING AN IMAGER MODULE WITH A PERMANENT CARRIER

FIELD OF THE INVENTION

Embodiments disclosed herein relate to fabrication of an imager module using wafer level fabrication techniques.

BACKGROUND

Microelectronic imagers are used in digital cameras, wireless devices with picture-taking capabilities, and many other applications. Mobile phones and personal digital assistants (PDAs), for example, are incorporating microelectronic imagers for capturing and sending pictures. The growth rate of microelectronic imagers has been steadily increasing as they become smaller and produce better images with higher resolution.

Microelectronic imagers include image sensors that typically use charged coupled device (CCD) systems or complementary metal-oxide semiconductor (CMOS) systems, as well as other systems. CCD image sensors have been widely used in digital cameras and other applications. CMOS image sensors are also quickly becoming very popular because they have low production costs, high yields, and small sizes.

As shown in FIG. 1, microelectronic imager modules 150 are often fabricated at a wafer level. The imager module 150 includes an imager die 108, which includes an imager array 106 and associated circuits. The imager array 106 may be a CCD or CMOS imager array, or any other type of solid state imager array. The imager module 150 also includes a lens stack 112, which includes at least one lens element 111 with at least one corresponding lens carrier 110. The lens carrier 110 maintains the lens element 111 at a proper distance from the imager array 106, such that a desired amount of light striking a convex side of the lens element 111 is directed through an aperture to the imager array 106. The lens carrier 110 may be bonded to the imager die 108 by a bonding material 104 such as epoxy. Typically, the lens element 111 comprises an optically transmissive glass or plastic material configured to focus light radiation onto imager array 106. In addition, the lens structure 112 can include multiple lenses, or may be combined with another optically transmissive element, such as a package lid. The fabrication of one imager module and associated lens support structure is discussed in co-owned U.S. patent application Ser. No. 11/605,131, filed on Nov. 28, 2006 and U.S. patent application Ser. No. 12/073,998, filed on Mar. 12, 2008, which are hereby incorporated by reference.

One consideration in the manufacture of image modules of the type illustrated in FIG. 1 is the process by which the lens carrier 110 is attached to the imager dies 108. Wafer level packaging (WLP) is a preferred method of packaging semiconductor components because it produces smaller form factors, higher output and lower cost devices. Thus, although FIG. 1 shows one imager module 150, in practice, image die 108 is part of a larger imager wafer containing many such dies, and the lens carrier 110 and lens element 111 are part of a larger lens wafer containing many such lens carriers 10 and lens elements 111. The lens carrier wafer and imager die wafer are bonded together to form many imager modules 150 that are then separated by a dicing operation. However, using wafer level processes to produce imager modules 150 is challenging.

One consideration in the fabrication of image sensor semiconductor components is how to protect against damage to the imager array 106 and associated integrated circuits within dies 108. Another consideration is how to fabricate and connect lens elements, and associated lens carrier structures to a wafer containing imager dies. It is necessary for the lens elements and the associated carrier structures to protect the integrated circuits, and to provide desired optical characteristics as well. It is also advantageous for the lens elements and the associated carrier structures to be capable of providing electrical paths for the integrated circuit with a die. It would also be advantageous to provide structures and/or associated carrier structures which would reduce the influence of electromagnetic interference (EMI) and electro static discharge (ESD) on circuit operations. Additionally, it would be advantageous to eliminate a shear or other debond process which occurs during fabrication when a temporary carrier wafer is used and needs to be separated from another wafer to which it is attached during certain processing operations.

DETAILED DESCRIPTION OF THE INVENTION

Embodiments of the invention relate to use of a permanent carrier during wafer level fabrication, which protects imager dies during the fabrication process. In addition, the permanent carrier is permanently attached to the imager die to support and attach a lens structure.

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, only some of which are discussed in detail below.

In several of the figures discussed below, the formation of a single imager die with a permanent carrier is detailed for purposes of simplicity in describing the process. It should be understood that, in practice, the apparatuses and methods described herein are used to form numerous imager dies and associated modules on respective wafers during wafer level processing.

A permanent carrier facilitates back end processing and eliminates the need for a lens standoff, creates a more durable wafer for transport and further eliminates the debond process used when temporary carriers are employed. A temporary carrier may be used during fabrication to protect the imager dies and support the imager die wafer. In order to remove the temporary carrier, a debond process is used in which the temporary carrier wafer and the imager wafer are slid horizontal relative to one another to break the bonding connecting the temporary carrier and imager wafer together. Additionally, the fabrication processes described herein does not require any adhesive to be formed over the imager array. Instead, the fabrication process utilizes other materials to reduce contamination during carrier and image wafer processing. Additionally, other conductive layers may be employed to reduce the influence of EMI and ESD. In the embodiments describe herein, the permanent carrier acts as a lens support structure, where the distance the lens is held from the image pixel is dependant on the thickness TH of the carrier.

The permanent and temporary carriers described herein can be made of semiconductor material. However, the permanent and temporary carriers can be any one of a plurality of materials including glass, semiconductor, ceramics or other appropriate material.

Figure 1:
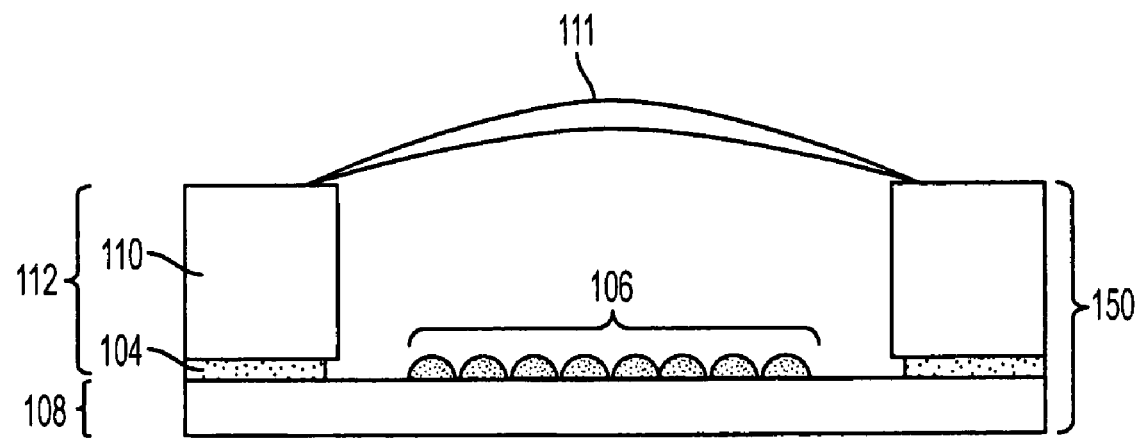
FIG. 1 is a cross sectional view of an imager.
Figure 2A:
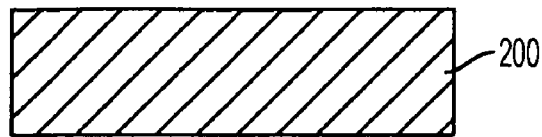
FIGS. 2A-2H are schematic cross sectional views illustrating steps in a wafer level method of fabricating semiconductor components with lens support structures.
Figure 2B:
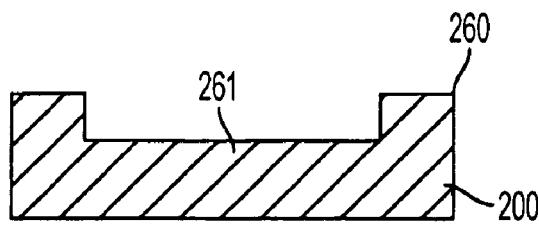
Figure 2C:
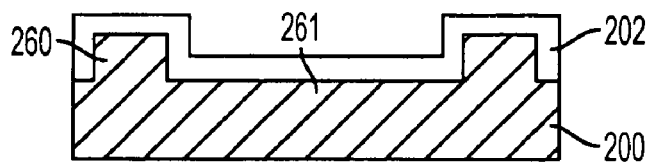
Figure 2D:
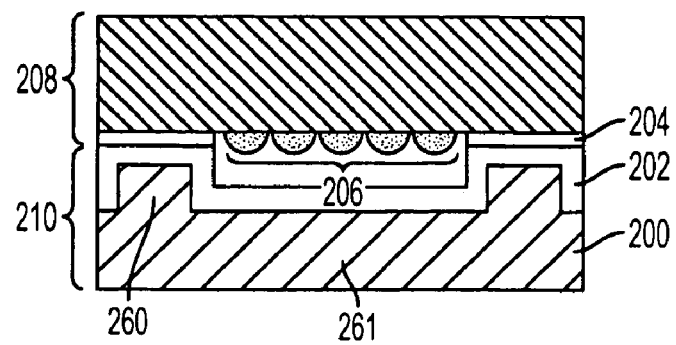

Embodiments of methods of fabricating permanent carriers and imager modules using the carriers are now discussed. Initially, as shown in FIG. 2A, a semiconductor substrate 200 is provided. The semiconductor substrate 200 will be used to fabricate a permanent carrier 210 (FIG. 2D). In FIG. 2B, the substrate 200 is etched. The semiconductor substrate 200 can be anisotropically etched through a mask using a solution of KOH and $H_2O$. The semiconductor substrate 200 can also be isotropically etched through a mask using a solution of HF, $HNO_3$ and $H_2O$. A dry etching process such as reactive ion etching (RIE) (also known as "BOSCH" etching) can be performed in a reactor with a suitable etch gas, such as CF4, SF6, Cl2 or CCl2F2. Substrate 200 is etched to form raised regions 260 which are shown in cross sections in FIG. 2B, but which encircle an area 261 of the substrate 200. A metal layer 202 is then formed over the substrate 200 (FIG. 2C). The metal layer 202 may be Ti/Cu (i.e., a layer of titanium and a layer of copper) or Ta/Cu (i.e., a layer of tantalum and a layer of copper) or stacks like Ti/Cu/Ti (i.e., a layer of titanium, a layer of copper, and a layer of titanium), for example. Prior to forming metal layer 202, an oxide dielectric layer (not shown) may optionally be formed to help adhere the metal layer 202 to the substrate 200. The metal layer 202 acts as a stop layer for later processing, reduces contamination of the imager array 206 (FIG. 2D) and can be used for electrical circuitry as described below. Next, an adhesive 204 is applied to the metal layer 202 or imager wafer 208 and the imager wafer 208 is attached to the carrier 210 (FIG. 2D) with the adhesive. By way of example, the imager wafer 208 can comprise a plurality of image sensor dice each having an imager pixel array 206, and a plurality of associated integrated circuits. The integrated circuits can include radiation sensitive integrated circuits in the pixel array 206, such as complimentary metal oxide semiconductor (CMOS) devices. The carrier 200 likewise has a plurality of areas 261 encircled by the raised regions 260.

Figure 2E:
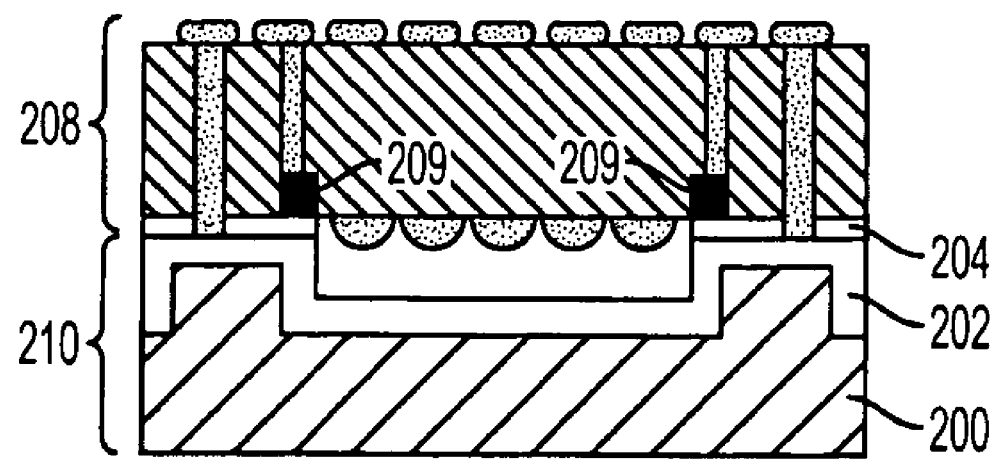

Next, back end processing is carried out on the imager wafer 208 after it is bonded with the permanent carrier 210 (FIG. 2E). During back end processing, solder balls are mounted onto electrical connections fabricated on the imager wafer 208 back side and vias are etched through the imager wafer 208, which will allow for the connection between the solder balls and die bond pads 209 located on the front side of each of the dies of the imager wafer 208. Additionally, during back end processing, connections are also made between the metal layer 202 and ground connections on the back side of the imager wafer 208. Additional connections may also be formed during back end processing. The imager wafer 208 may optionally be thinned by dry etching, wet etching, grinding, chemical mechanical planarization (CMP) or any combination thereof.

Figure 2F:
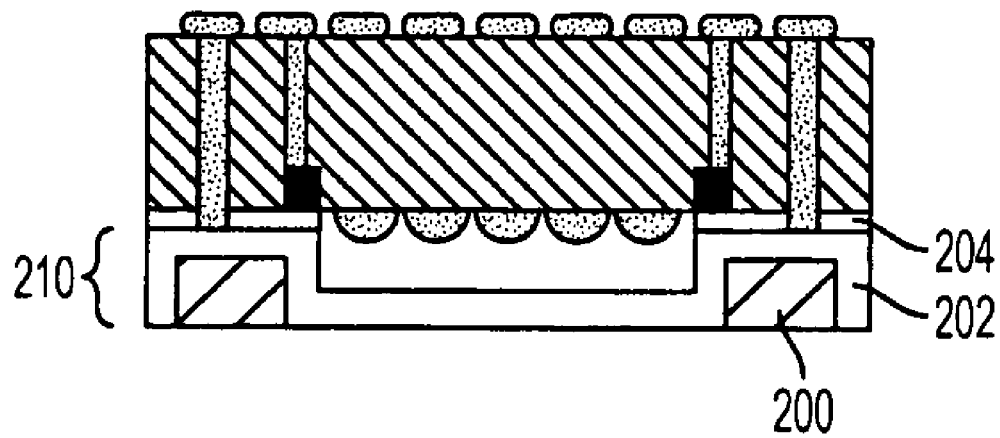
Figure 2G:
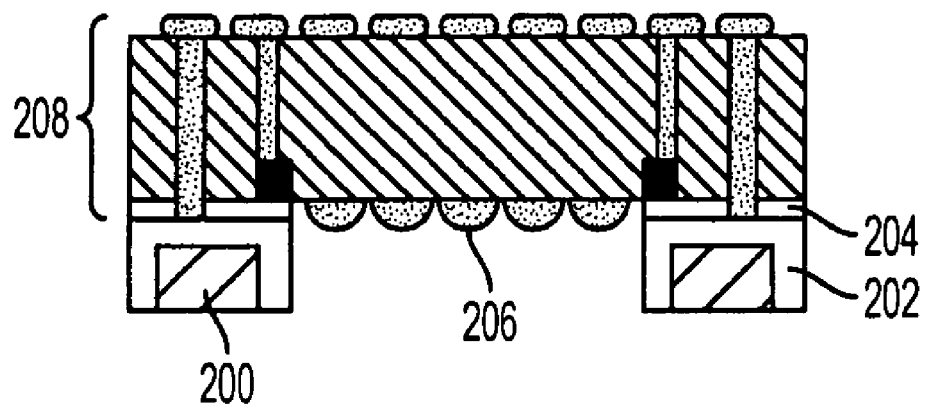

After back end processing is complete, the substrate 200 of the carrier 210 is thinned by dry etching, wet etching, grinding, chemical mechanical planarization (CMP) or any combination thereof until the metal layer 202 is exposed (FIG. 2F). Typically, the substrate 200 will first be ground and then etched down to the metal layer 202 (FIG. 2F). The metal layer 202 is then either ground or wet etched until the imager array 206 is exposed (FIG. 2G).

Figure 2H:
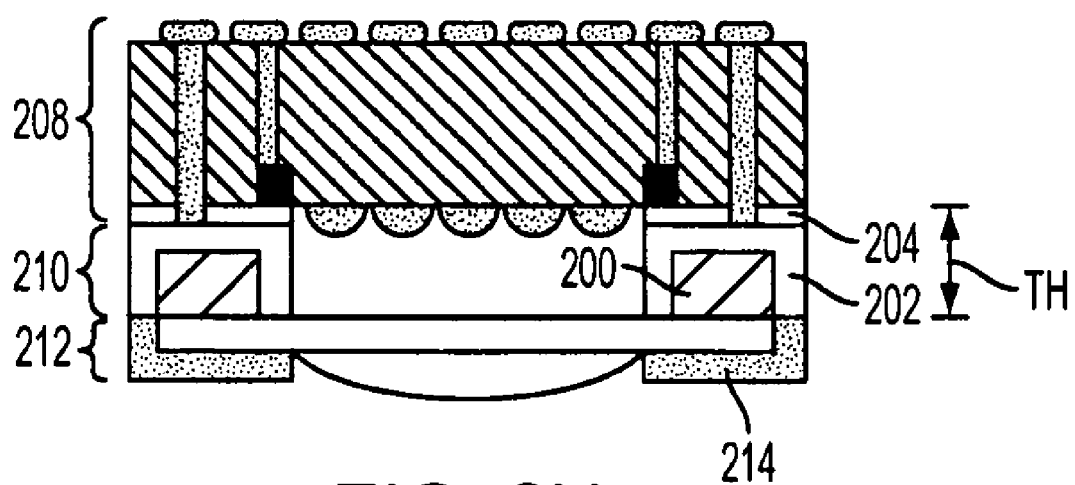
Figure 8:
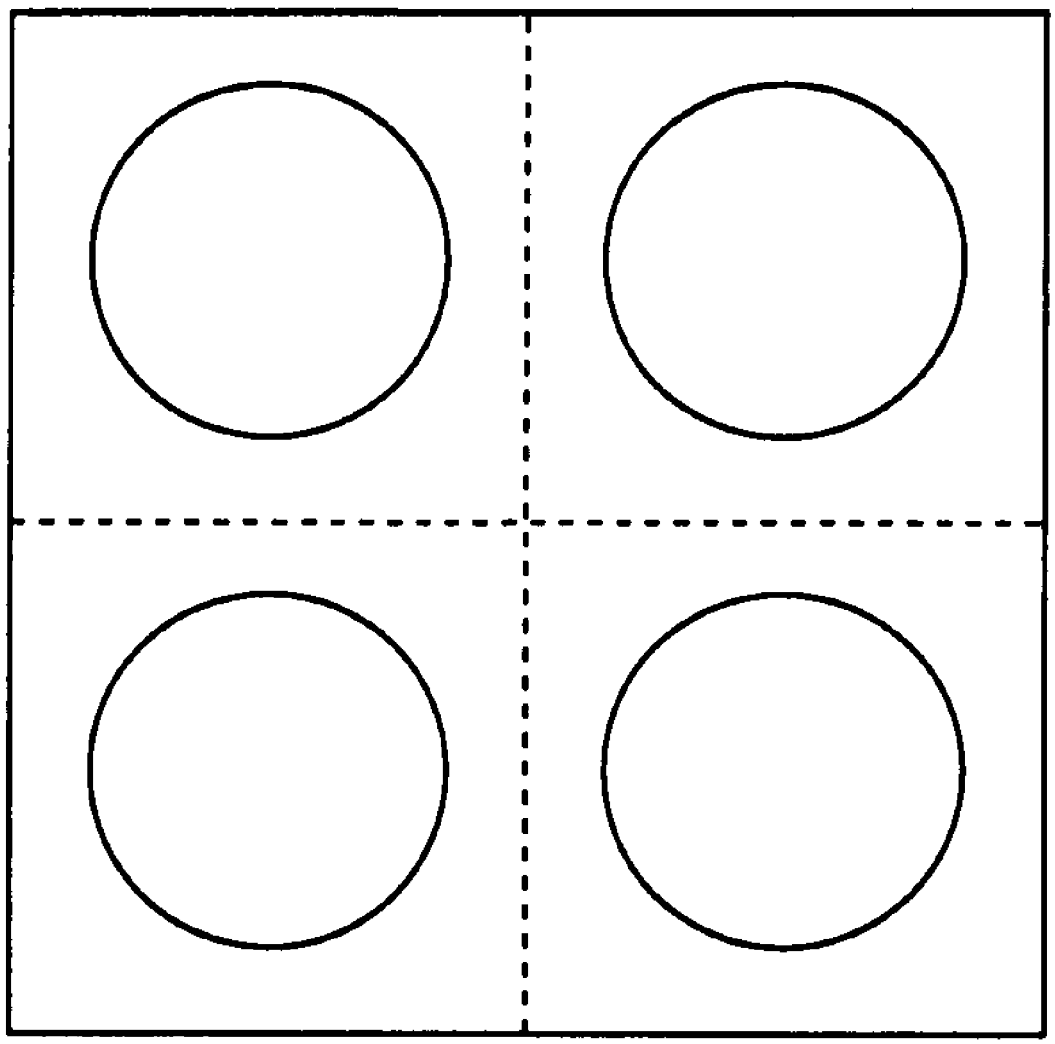
FIG. 8 illustrates a top down view of the imager modules before dicing.

After wafer level processing is complete, a lens wafer, containing an array of lenses in positions corresponding to locations of imager dice on imager wafer 208, can be attached to the wafer level lens assembly. The lens array 212 is attached to the permanent carrier 210 and may optionally include metal contacts 214 (FIG. 2H). The metal contacts 214 can be connected to the carrier using conductive paste or conductive adhesive. The metal contacts 214 and the metal layer 202 of the permanent carrier 210 may be connected to a ground conductor on the back side of the imager wafer 208. By connecting the metal contacts 214 and the metal layer 202, the metal contacts 214 and the metal layer 202 provide EMI and ESD shielding. After wafer level lens assembly is complete, the imager modules are diced apart as shown by the dashed lines in FIG. 8 which represents a top down view of a wafer lens assembly containing a plurality of undiced wafer level modules. This embodiment protects the image sensors from damage during fabrication, reduces the influence of EMI and ESD and eliminate the debond process.

One consideration in the fabrication of image sensor semiconductor components is how to avoid damage to the imager array 106 and associated integrated circuits within the dies 108. Another consideration is how to fabricate and connect lens elements, and associated lens carrier structures to a wafer containing imager dies. It is necessary for the lens elements and the associated carrier structures to protect the integrated circuits, and to provide desired optical characteristics as well. It is also advantageous for the lens elements and the associated carrier structures to be capable of providing electrical paths for the integrated circuit with a die. It is also advantageous to provide structures and/or associated carrier structures that would reduce the influence of electromagnetic interference (EMI) and electro static discharge (ESD) on circuit operations. Additionally, it is advantageous to eliminate the debond process that occurs during fabrication when a temporary carrier wafer is used and needs to be separated from another wafer to which is attached during certain processing operations.

Figure 3A:
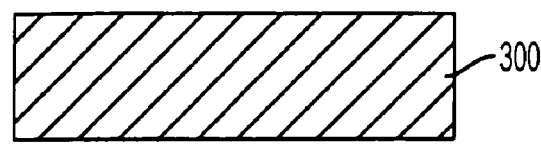
FIGS. 3A-3H are schematic cross sectional views illustrating steps in a wafer level method of fabricating semiconductor components with lens support structures.
Figure 3B:
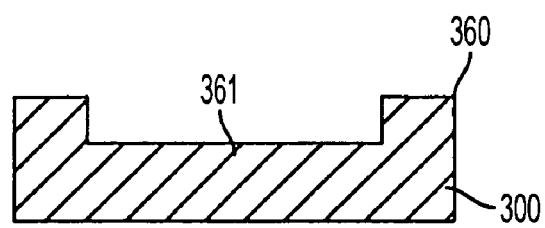
Figure 3C:
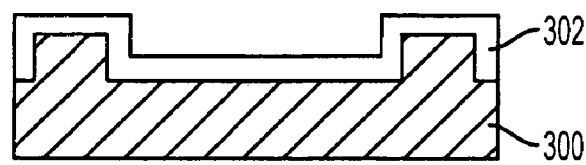
Figure 3D:
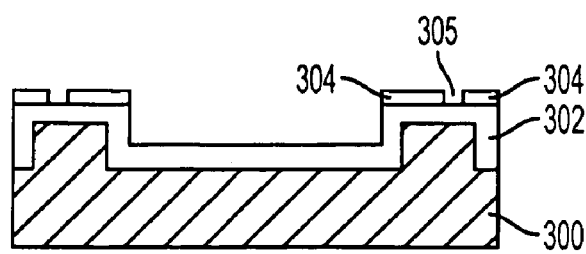

Another embodiment is now discussed with reference to FIGS. 3A-3H. Initially, as shown in FIG. 3A, a substrate 300, which may be a semiconductor or one of the other substrate materials described above, is provided. As shown in FIG. 3B, the substrate 300 is etched as discussed above with regard to FIG. 2B to form raised regions 360, which encircle an area 361 of the substrate 300. After the substrate 300 has been etched, a metal layer 302 is formed on the substrate 300 (FIG. 3C). The metal layer 302 may be made of Ti/Cu or Ta/Cu or stacks like Ti/Cu/Ti, for example. Prior to forming metal layer 302, an oxide dielectric layer may optionally be formed to help adhere the metal layer 302 to the substrate 300. The metal layer 302 also acts as a stop layer for later processing and also reduces contamination of the imager array 306. Next, a permanent adhesive 304 is applied to the metal layer 302 (FIG. 3D). Openings 305 in the adhesive layer 304 are provided. The openings 305 in the adhesive 304 allow for connections between the back side of the imager wafer 308 and the metal layer 302.

Figure 3E:
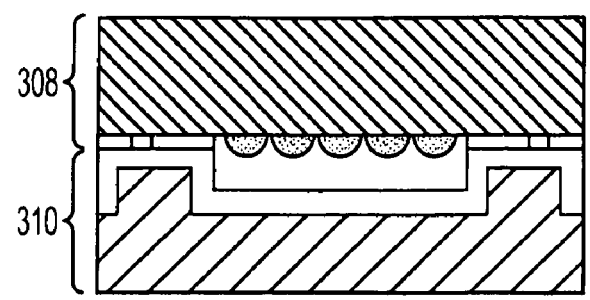
Figure 3F:
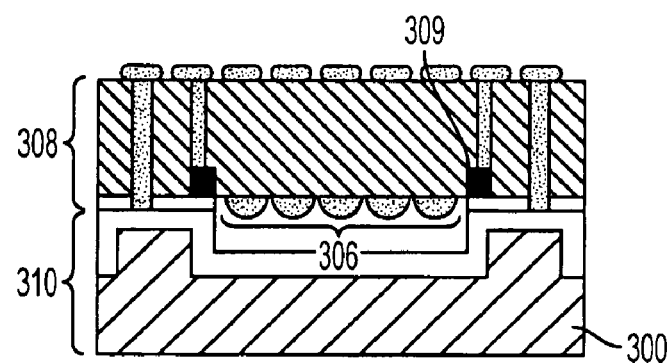

Next, back end processing is carried out on the imager wafer 308 after it is bonded with the permanent carrier 310 (FIG. 3E). During back end processing solder balls are also mounted onto electrical connections fabricated on the imager wafer 308 back side and vias are etched through the imager wafer 308, which will allow for the connection between the solder balls and die bond pads 309 located on the front side of each of the dies of the imager wafer 308. Additionally, during back end processing connections are also made between the metal layer 302, via openings in the adhesive layer 305, and ground connections on the back side of the imager wafer 308. Additional connections may also be formed during back end processing. The via routed through the adhesive 304 allows the layer 302 to act as an EMI and ESD shield. The imager wafer 308 may optionally be thinned by dry etching, wet etching, grinding, chemical mechanical planarization (CMP) or any combination thereof.

Figure 3G:
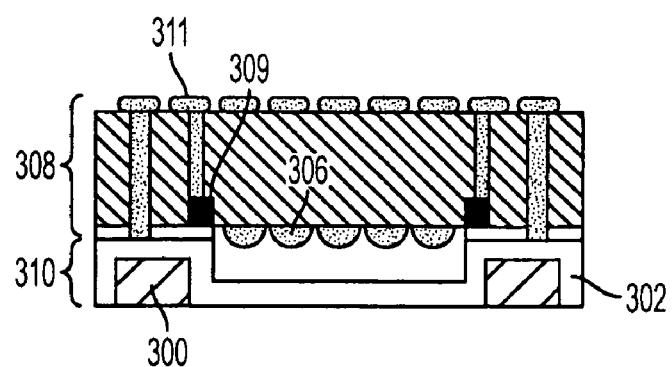
Figure 3H:
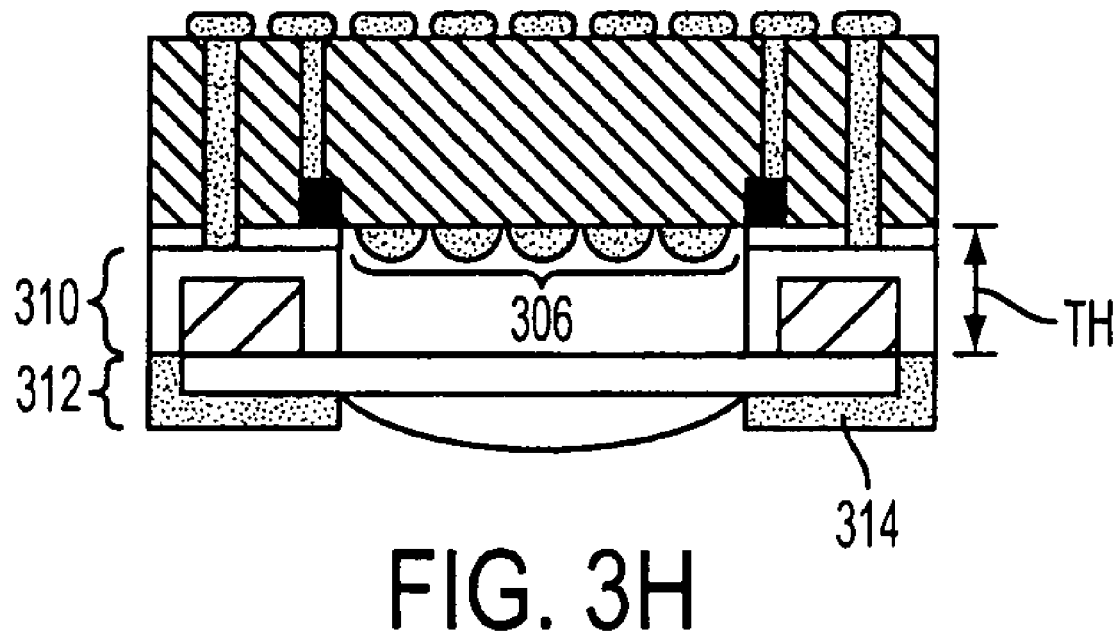

After back end processing is complete, the substrate 300 of the carrier 310 is thinned by dry etching, wet etching, grinding or CMP, or combination thereof until the metal layer 302 is exposed (FIG. 3G). Typically, the substrate 300 will first be ground and then etched down to the metal layer 302. The metal layer 302 is then either ground or wet etched until the imager array 306 is exposed (FIG. 3H).

After wafer level processing is complete, the lens structure 312 is attached to the permanent carrier 310. The lens array 312 may optionally include metal contacts 314 on the top and sides of the lens array 312. The metal contacts 314 and the metal layer 302 of the permanent carrier 310 may be connected to a ground conductor on the back side of the imager wafer 308. By connecting the metal contacts 314 and the metal layer 302, the metal contacts 314 and the metal layer 302 provide EMI and ESD shielding. After wafer level lens assembly is complete, the imager modules are diced apart as shown by the dashed lines in FIG. 8, which represents a top down view of a wafer lens assembly containing a plurality of undiced wafer level modules. This embodiment protects the image sensors from damage during fabrication, reduces the influence of EMI and ESD and eliminates the debond process.

Figure 4A:
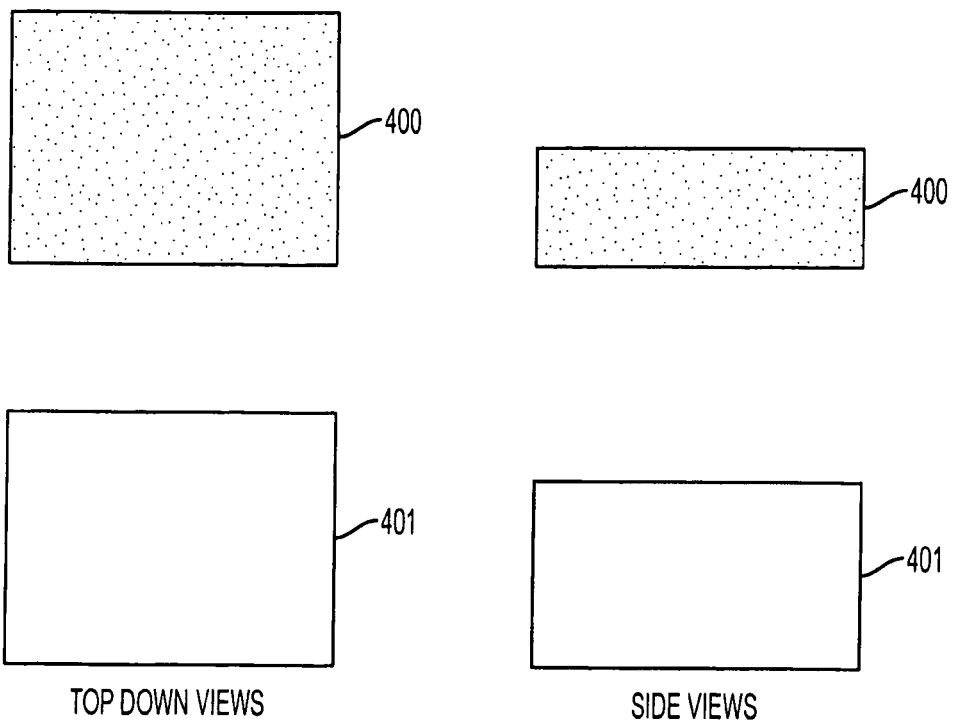
FIGS. 4A-4I are schematic views illustrating steps in a wafer level method of fabricating semiconductor components with lens support structures.
Figure 4B:
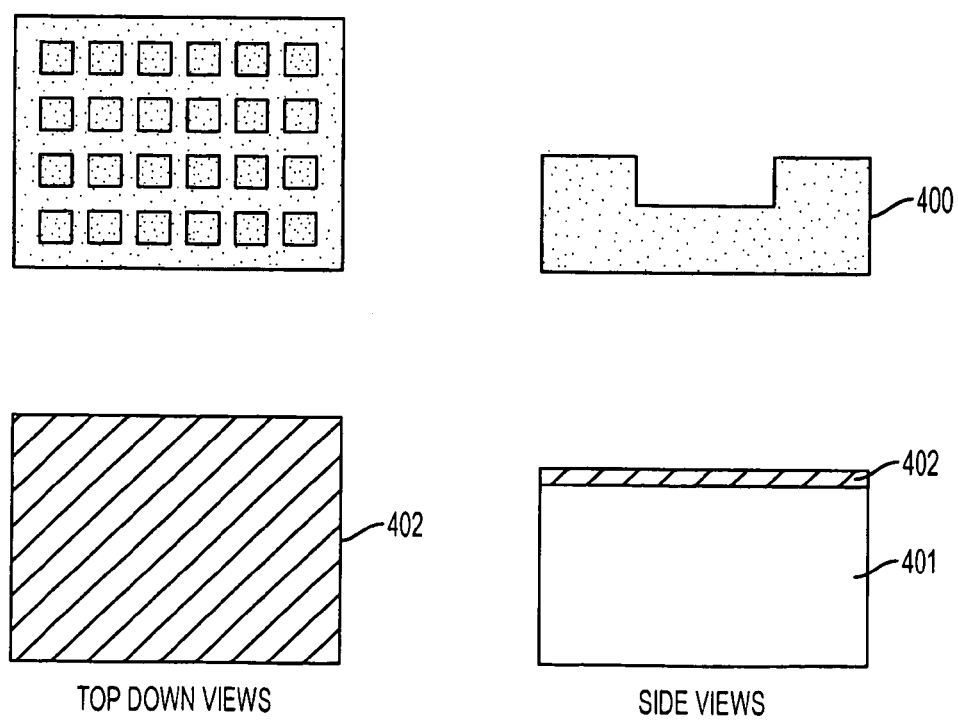
Figure 4C:
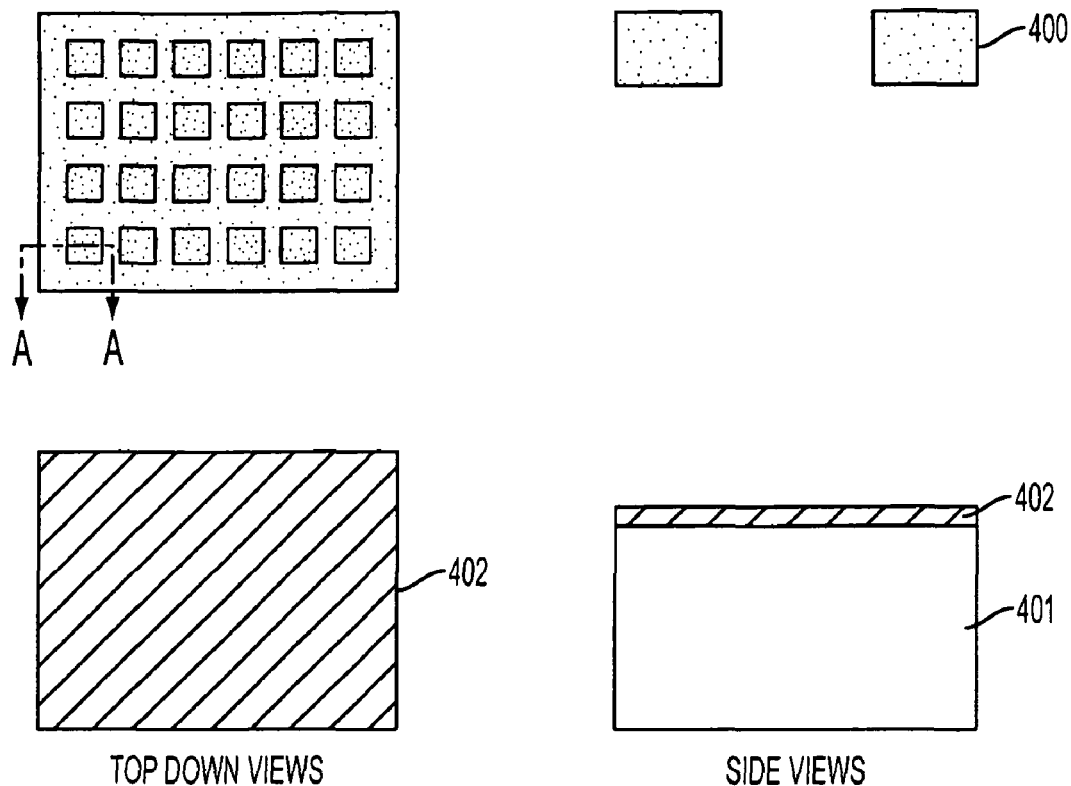
Figure 4D:
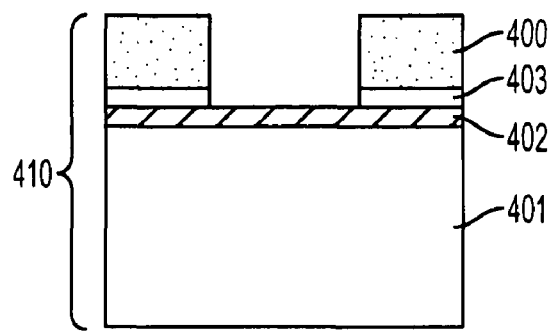
Figure 4E:
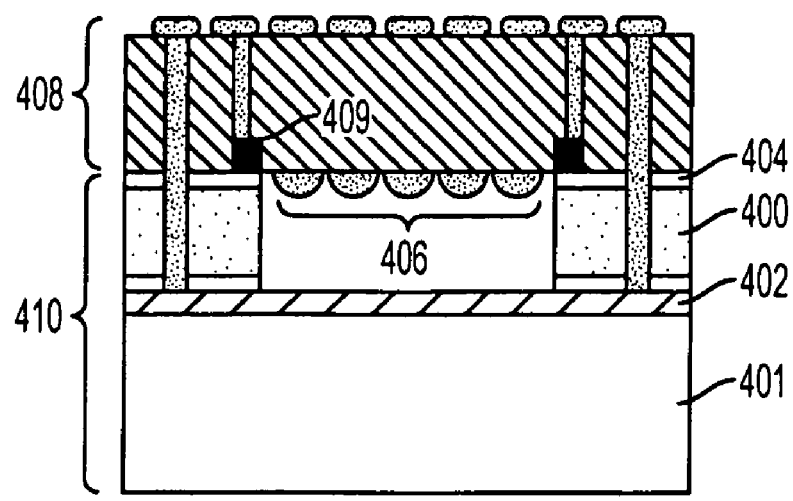

Another method of forming a permanent carrier and imager modules is now discussed with reference to FIGS. 4A-4G. FIGS. 4A-C illustrate top down and side view of the steps of the wafer fabrication process. In FIG. 4A, two substrates 400, 401 are provided. As shown in FIG. 4B, the first substrate 400 is etched, as discussed above with regard to FIG. 2B. The second substrate 401 is coated with a stop layer 402. The coating could be made of metal, e.g., Ta, Cu, Ti etc., a hard dielectric, e.g., SiN, SiCN, other material, e.g., polymer, $SiO_2$ etc., or IR block, e.g., Ti, black polymer, etc. Next, the back side (i.e., the side of substrate 400 that was not etched) of first substrate 400 is ground to a uniform thickness to create the desired depth of the first substrate 400 to form spacers (FIG. 4C). Cross section line A in the top down view of FIG. 4C illustrates the vantage point of the side view of substrate 400 in the side view. In FIG. 4D, the first substrate 400 is bound to the second substrate 401 and the stop layer 402, using an adhesive 403 (for example, an epoxy). Next the imager wafer 408 is attached to the permanent carrier 410 and back end processing is performed on the imager wafer 408 (FIG. 4E).

During back end processing, solder balls are also mounted onto electrical connections fabricated on the imager wafer 408 back side and vias are etched through the imager wafer 408 to allow for the connection between the solder balls and die bond pads 409 located on the front side of each of the dies of the imager wafer 408. Additionally, during back end processing connections are also made between the metal layer 402 and ground connections on the back side of the imager wafer 408. Additional connections may also be formed during back end processing. The imager wafer 408 may optionally be thinned by dry etching, wet etching, grinding, chemical mechanical planarization (CMP) or any combination thereof.

Figure 4F:
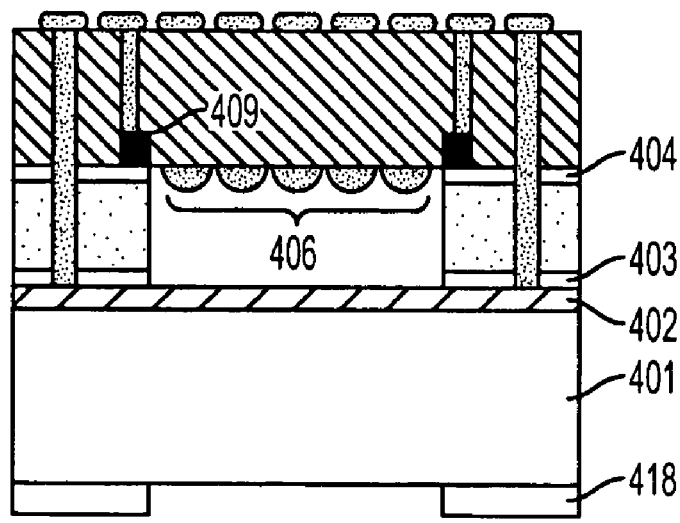
Figure 4G:
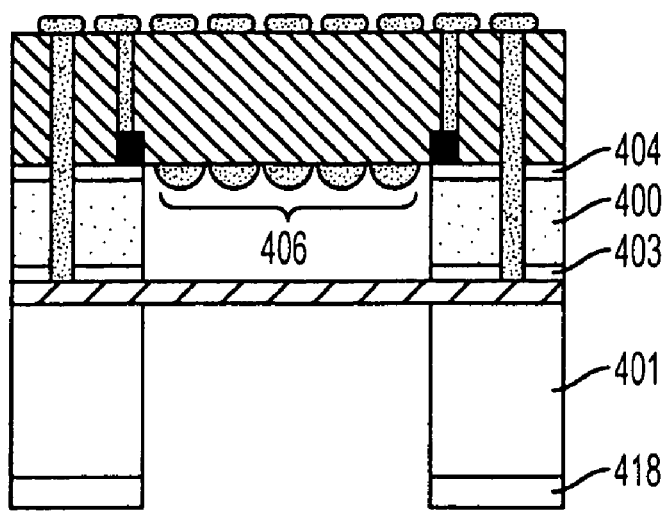
Figure 4H:
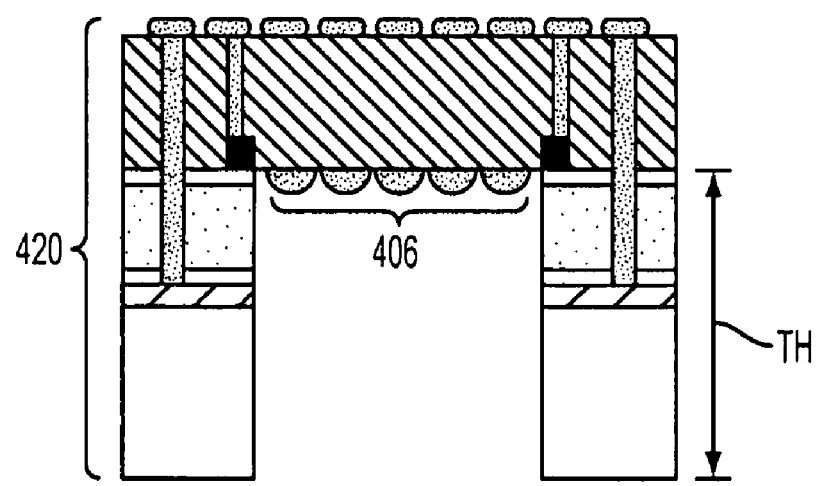

After the back end processing of the imager wafer 408, the second substrate 401 is ground to a desired thickness and a resist 418 is patterned on the substrate 401 (FIG. 4F). The second substrate 401 is then etched as shown in FIG. 4G. The stop layer 402 is then etched and the resist 418 is removed. Accordingly, the thickness TH (FIG. 4H) of the permanent carrier 410, which determines the distance the lens array (not shown) is from the imager array 406, is dependent on the thickness of the two substrates 400, 401.

Figure 4I:
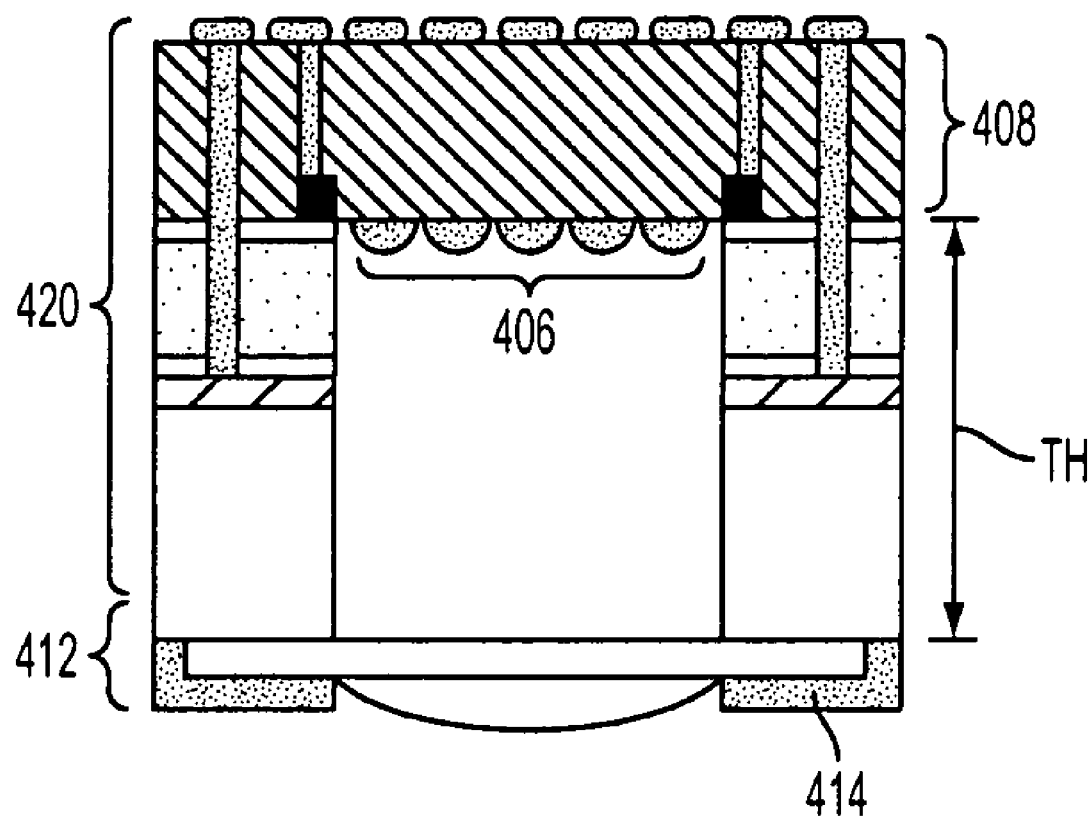

After wafer level processing is complete, the lens structure 412 is attached to the permanent carrier 410 (FIG. 4I). The lens array 412 may optionally include metal contacts 414 on the top and sides of the lens array 412. The metal contacts 414 and the metal layer 402 of the permanent carrier 410 may be connected to a ground conductor on the back side of the imager wafer 408. By connecting the metal contacts 414 and the metal layer 402, the metal contacts 414 and the metal layer 402 provide EMI and ESD shielding. The second substrate 401 could be a conductor and allow contact between 414 and 402. After wafer level lens assembly is complete, the imager modules are diced apart as shown by the dashed lines in FIG. 8, which represents a top down view of a wafer lens assembly containing a plurality of undiced wafer level modules.

Figure 5A:
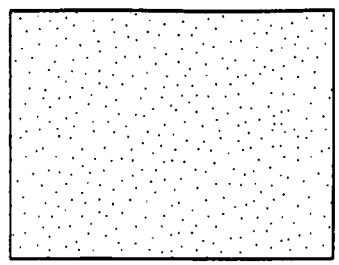
FIGS. 5A-5I are schematic views illustrating steps in a wafer level method of fabricating semiconductor components with lens support structures.
Figure 5A:
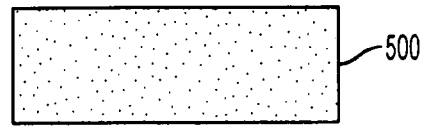
Figure 5A:
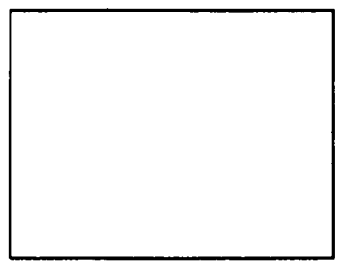
Figure 5A:
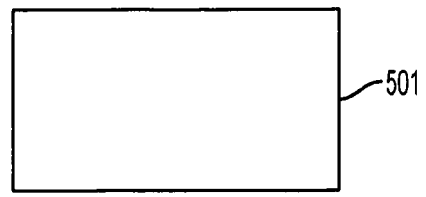
Figure 5B:
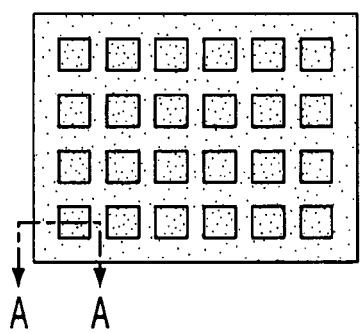
Figure 5B:
Figure 5B:
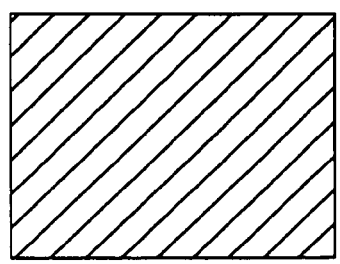
Figure 5B:
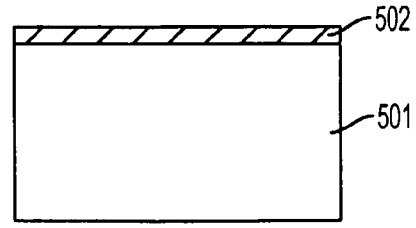
Figure 5C:
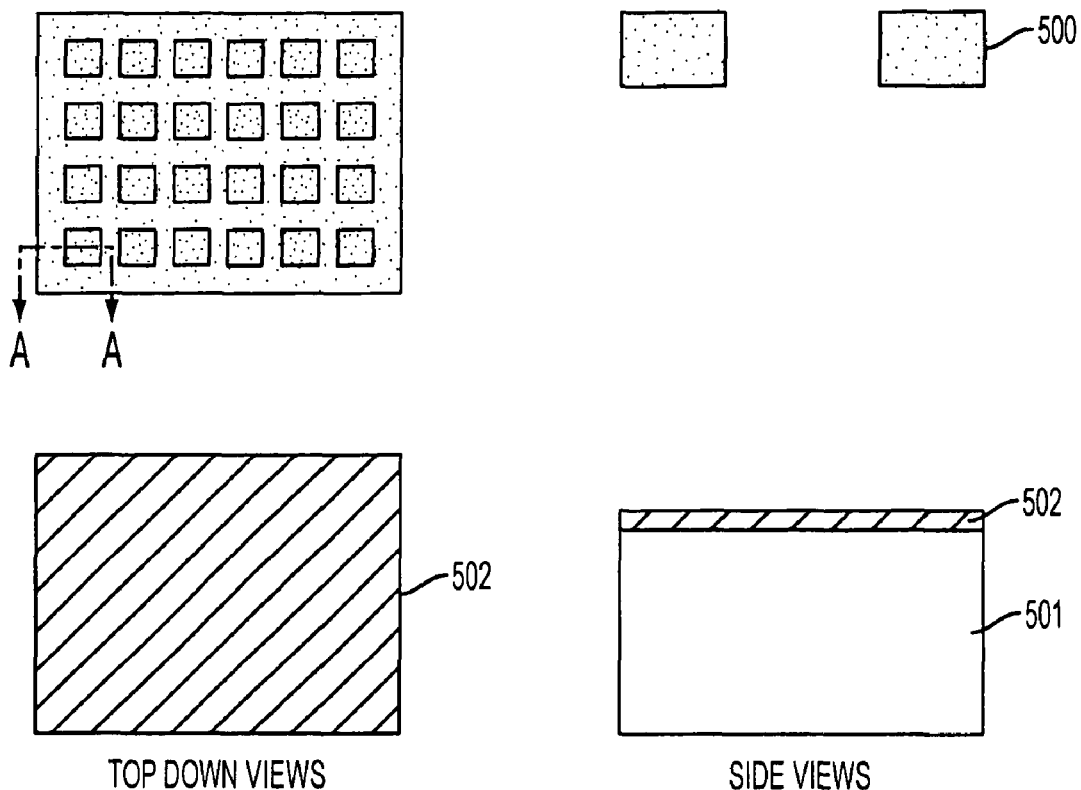
Figure 5D:
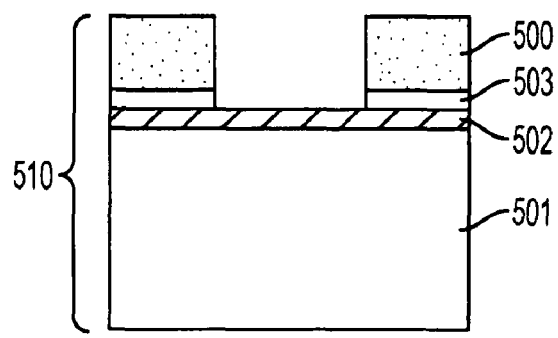

Another method of forming a permanent carrier and using the same in an imager module is now discussed with reference to FIGS. 5A-5I. The steps illustrated in FIGS. 5A-E are the same as those illustrated and discussed with respect to FIGS. 4A-E. Accordingly, those steps will not be discussed again. FIGS. 5A-5C illustrate the top down and side view of the steps in the wafer fabrication process. Illustrated throughout the figures is a first substrate 500, a second substrate 501, a stop layer 502, an adhesive 503, an imager wafer 508 and a carrier 510.

Figure 5E:
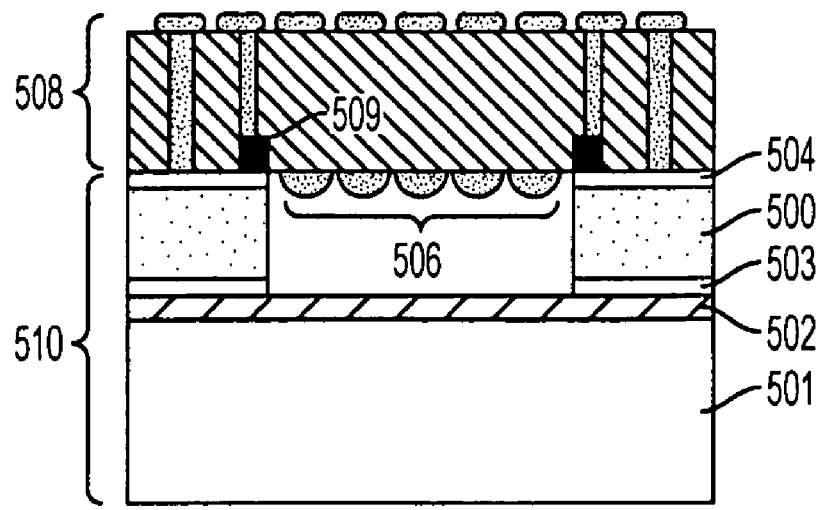

Back end processing is carried out on the imager wafer 508 after it is bonded with the permanent carrier 510 (FIG. 5E). During back end processing solder balls are also mounted onto electrical connections fabricated on the imager wafer 508 back side and vias are etched through the imager wafer 508, which will allow for the connection between the solder balls and die bond pads 509 located on the front side of each of the dies of the imager wafer 508. Additional connections may also be formed during back end processing. The imager wafer 508 may optionally be thinned by dry etching, wet etching, grinding, chemical mechanical planarization (CMP) or any combination thereof.

Figure 5F:
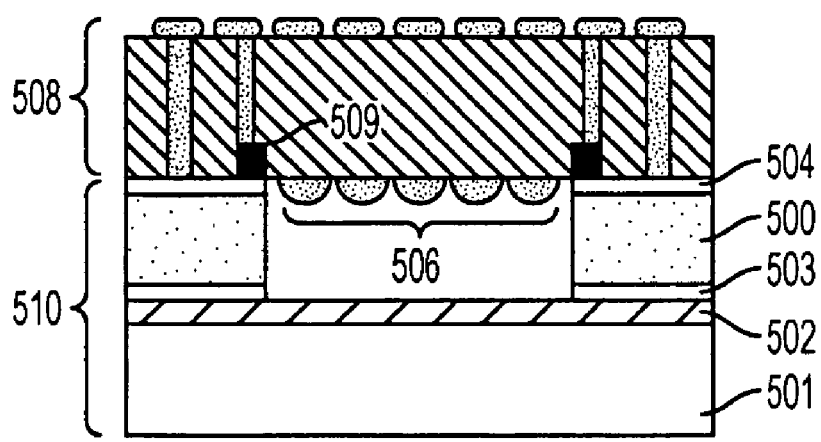
Figure 5G:
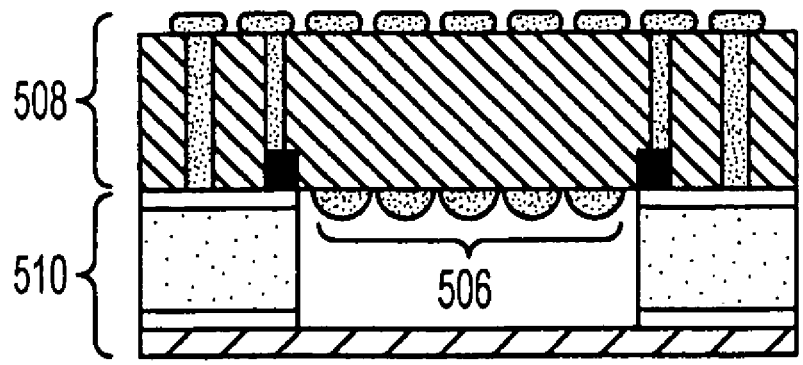
Figure 5H:
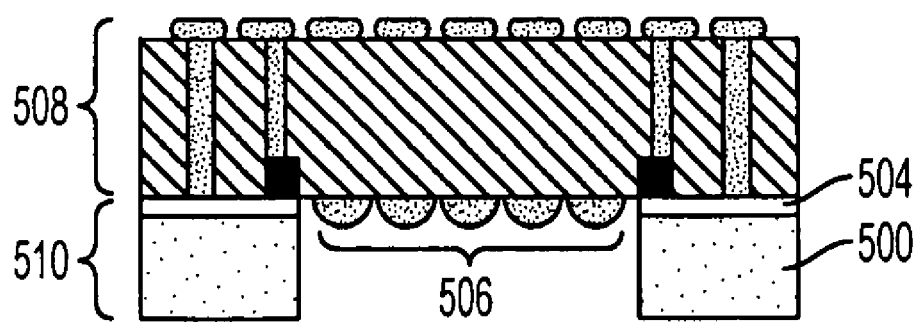

After the back end processing is performed on the imager wafer 508, the second substrate 501 is ground to a desired thickness (FIG. 5F). This step eliminates any non-uniformity caused by etching the permanent carrier 510. The remaining layer of the second substrate 501 is then ground or wet etched (FIG. 5G) to the stop layer 502. The stop layer 502 is then etched (FIG. 5H). The adhesive layer 503 may optionally be removed before the lens array (not shown) is mounted to the permanent carrier 510.

Figure 5I:
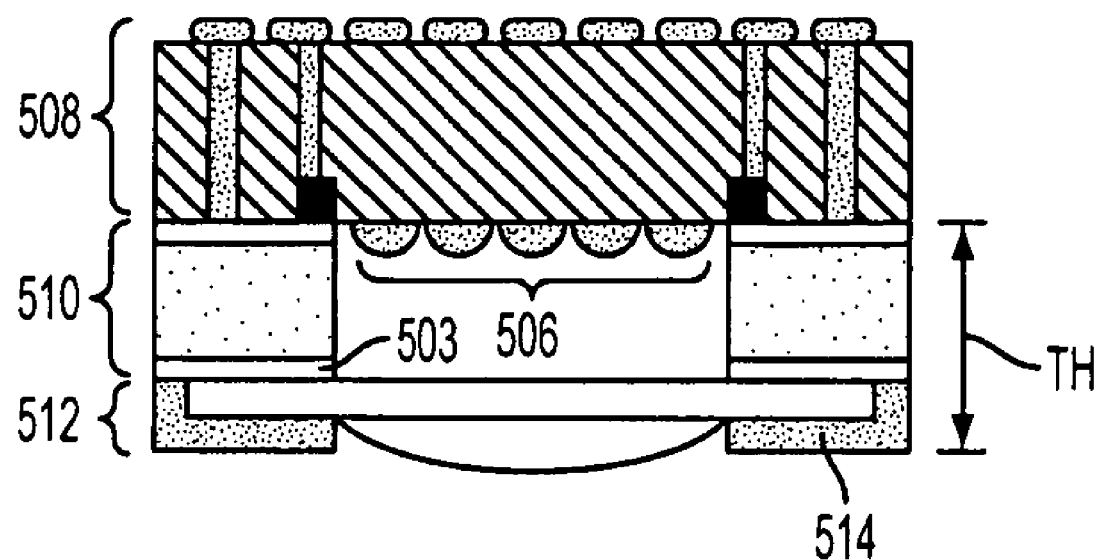

After wafer level processing is complete, the lens structure 512 is attached to the permanent carrier 510 (FIG. 5I). The lens array 512 may optionally include metal contacts 514 on the top and sides of the lens array 512. The metal contacts 514 may optionally be connected to a ground conductor on the back side of the imager wafer 508. By connecting the metal contacts 514 to ground, EMI and ESD shielding is provided. After wafer level lens assembly is complete, the imager modules are diced apart as shown by the dashed lines in FIG. 8, which represents a top down view of a wafer lens assembly containing a plurality of undiced wafer level modules.

The embodiments illustrated in FIGS. 4A-5I may also include the use of diluted acids in etching the stop layer 402, 502. Additionally, if the stop layer 402, 502 is made of a water soluble polymer, the etching (either wet or dry) will not etch the stop layer 402, 502.

Figure 6A:
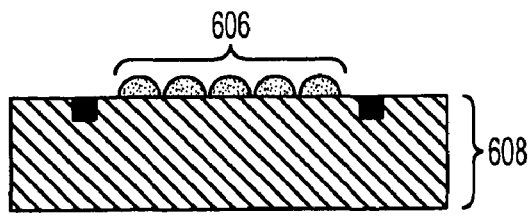
FIGS. 6A-6G are schematic cross sectional views illustrating steps in a wafer level method of fabricating semiconductor components with lens support structures.
Figure 6B:
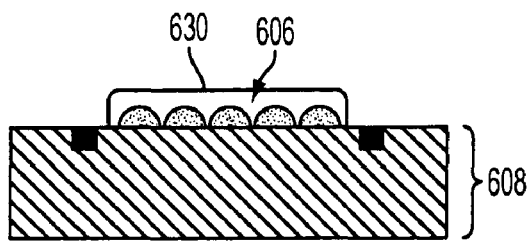
Figure 6C:
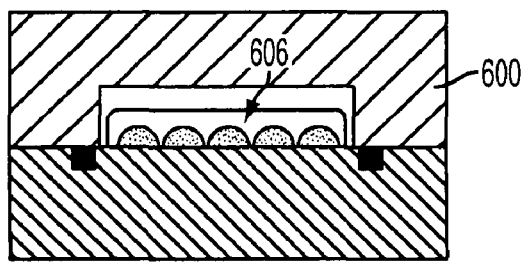
Figure 6D:
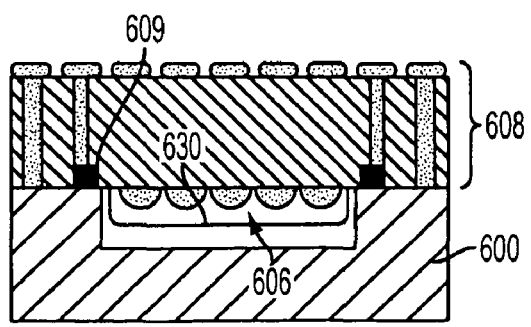

FIGS. 6A-6G illustrate another process and embodiment for fabricating a permanent carrier and using it to form an imager module. FIG. 6A illustrates an imager wafer 608 ready for processing (i.e., grinding etc.) and having imager array 606 formed therein. In FIG. 6B, a photo-definable protective encapsulant 630 is deposited over the imager array 606. The encapsulant 630 protects the imager array 606 from damage during the carrier 600 formation process and back end wafer processing. As shown in FIG. 6C, a pre-patterned carrier wafer 600 is bonded to the imager wafer 608. Although FIGS. 6A-6G illustrate a pre-patterned carrier, this embodiment is not limited to the use of a pre-patterned carrier. The carrier wafer 600 and the imager wafer 608 are ground to the required thicknesses. As shown in FIG. 6D, the imager wafer 608 is flipped and back end processing is carried out on the imager wafer 608.

During back end processing, solder balls are also mounted onto electrical connections fabricated on the imager wafer 608 back side and vias are etched through the imager wafer 608 to allow for the connection between the solder balls and die bond pads 609 located on the front side of each of the dies of the imager wafer 608. Additional connections may also be formed during back end processing. The imager wafer 608 may optionally be thinned by dry etching, wet etching, grinding, chemical mechanical planarization (CMP) or any combination thereof.

Figure 6E:
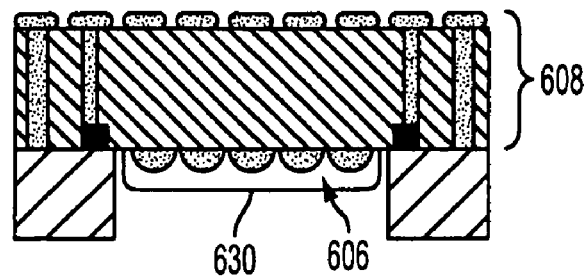
Figure 6F:
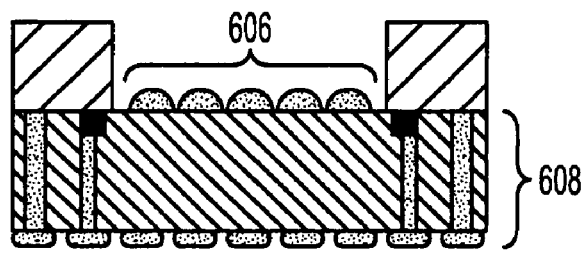
Figure 6G:
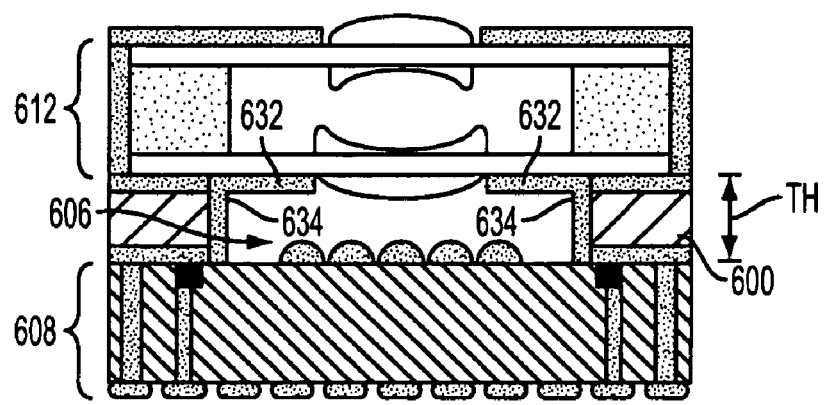

Next, as shown in FIG. 6E, the carrier wafer 600 is etched or ground until an opening is created exposing the imager array 606. The carrier 600 is also ground or etched until the carrier 600 is the desired thickness to space the lens array 612 from the imager array 606. As shown in FIG. 6F, the encapsulant 630 is dissolved using photo develop, wet solvent strip or plasma cleans or a combination thereof. In FIG. 6G the lens array 612 is mounted to the carrier 600. Optionally, a conductive shielding may be formed on the front side 632 of the lens array 612 and on the sides 634 of the carrier 600. The conductive shielding may be connected to the back side of the imager wafer 608. An epoxy can be used to adhere the shield to the front side 632 of the lens array 612 and the sides 634 of the carrier 600. The shield provides shielding of the array to prevent EMI and ESD from affecting the integrated circuit operation. The stop layer or metal layer discussed above may also be used in this carrier fabrication method.

Figure 7A:
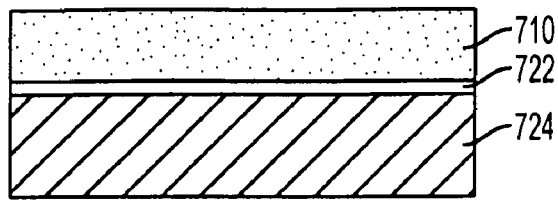
FIGS. 7A-7E are schematic cross sectional views illustrating steps in a wafer level method of fabricating semiconductor components with lens support structures.
Figure 7B:
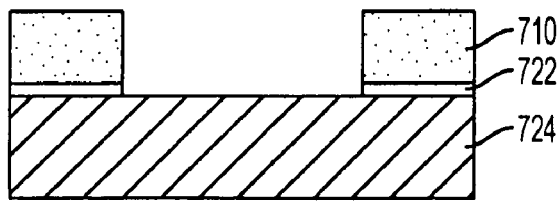
Figure 7C:
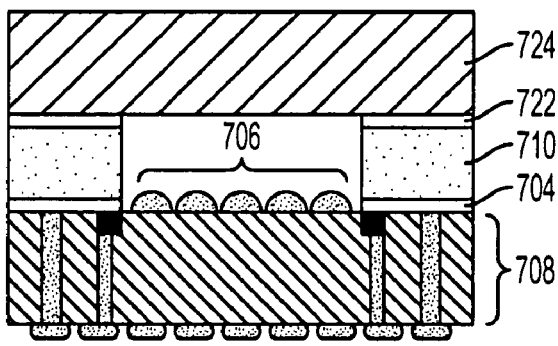

FIGS. 7A-7E illustrate another method of fabricating a lens carrier. A permanent carrier 710 is bonded with a temporary carrier 724 with a temporary adhesive 722 (FIG. 7A). The permanent carrier 710 material could also be deposited onto the temporary carrier 724 with a sacrificial layer in between. A standoff pattern is then etched into the permanent carrier 710 and the temporary adhesive 722 (FIG. 7B). Alternatively, the standoff pattern can be etched into the permanent carrier 710 prior to bonding to the temporary carrier 724 (not shown). This would allow the freedom to have the temporary adhesive 722 under the etched cavities and/or not have adhesive under the cavities. The permanent carrier 710 is then bonded to the imager wafer 708 with permanent adhesive 704 (FIG. 7C). This stack is then ready for back grinding and subsequent processing.

During back end processing, solder balls are also mounted onto electrical connections fabricated on the imager wafer 708 back side and vias are etched through the imager wafer 708 to allow for the connection between the solder balls and die bond pads 709 located on the front side of each of the dies of the imager wafer 708. Additional connections may also be formed during back end processing. The imager wafer 708 may optionally be thinned by dry etching, wet etching, grinding, chemical mechanical planarization (CMP) or any combination thereof.

Figure 7D:
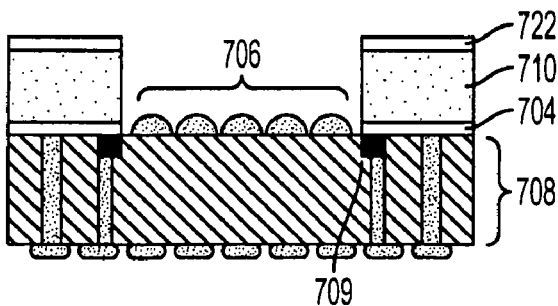

Once the back end processing is complete, the temporary carrier 724 and temporary adhesive 722 are removed from the permanent carrier 710 (FIG. 7D). Another alternative to the flow illustrated and described with respect to FIGS. 7A-D includes not etching the temporary adhesive 722 when the permanent carrier 710 is etched, thus leaving a blanket of adhesive 722. The stop layer or metal layer discussed above may also be used in this carrier fabrication method.

Figure 7E:
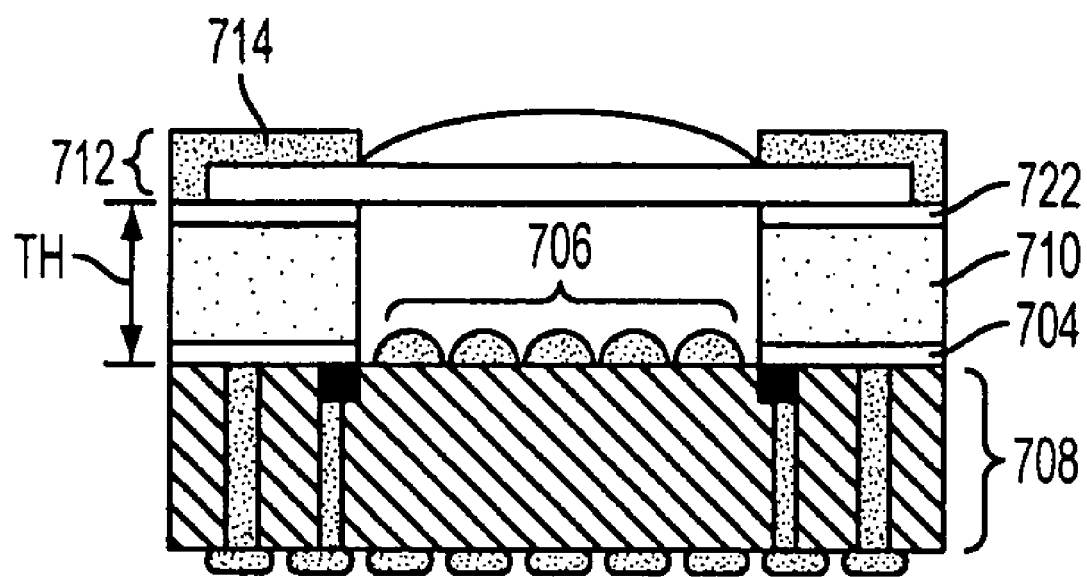

In FIG. 7E, the lens array 712 is mounted to the carrier 710. The lens array 712 may optionally include metal contacts 714 on the top and sides of the lens array 712. The metal contacts 714 may be connected to a ground conductor on the back side of the imager wafer 708. By connecting the metal contacts 714 to ground, EMI and ESD shielding is provided. After wafer level lens assembly is complete, the imager modules are diced apart as shown by the dashed lines in FIG. 8, which represents a top down view of a wafer lens assembly containing a plurality of undiced wafer level modules.

Prior and subsequent to the process described above, other elements described in steps may be added to each imager die in order to form complete imager modules. The embodiments described above should not be limited to the steps and elements described therein.

The above description and drawings illustrate embodiments which achieve the objects, features, and advantages described. Although certain advantages and embodiments have been described above, those skilled in the art will recognize that there may be many others. For example, the steps in the method described in FIGS. 7A-7E may be performed in a different order, or may include some variations, such as alternative materials having similar functions (i.e., glass as the carrier substrate).

What is claimed as new and desired to be protected by Letters Patent of the United States is:

1. A method of fabricating a semiconductor component comprising:
   providing an imager wafer containing a plurality of imager integrated circuits;
   forming a first carrier wafer having a plurality of recesses formed therein;
   attaching the first carrier wafer and imager wafer such that the recesses align with and face the imager integrated circuits;
   processing a back side of the imager wafer; and
   attaching a lens wafer comprising a plurality of lens structures to the carriers with the lens structure of the lens wafer aligned with the opened recesses and image integrated circuits.

2. The method of claim 1, wherein forming the first carrier wafer comprises providing a semiconductor wafer comprising a plurality of semiconductor substrates.

3. The method of claim 1, further comprising processing a side of the first carrier wafer opposite the side containing the recesses to open the recesses before attaching the first carrier and the imager wafer.

4. The method of claim 1, further comprising processing a side of the first carrier wafer opposite the side containing the recesses to open the recesses after attaching the first carrier wafer and the imager wafer.

5. The method of claim 1, wherein process of forming the first carrier wafer includes thinning a semiconductor substrate.

6. The method of claim 1, wherein forming the first carrier wafer comprises one of grinding, chemical mechanical planarization (CMP), and etching a substrate of the first carrier wafer.

7. The method of claim 1, wherein forming the first carrier wafer comprises forming a stop layer over a first carrier substrate.

8. The method of claim 1, wherein forming the first carrier wafer comprises processing a semiconductor substrate to form conductors on the semiconductor substrate, and terminal contacts on the semiconductor substrate in electrical communication with the conductors.

9. The method of claim 1, wherein a substrate of the first carrier wafer comprises a material selected from the group consisting of glass materials, semiconductor materials and ceramic materials.

10. The method of claim 1, wherein processing the back side of the imager wafer includes connecting the back side of the imager wafer with bond pads on the front side of the imager wafer.

11. The method of claim 1, further comprises attaching the imager wafer to the carrier using a polymer adhesive.

12. The method of claim 1, wherein forming the first carrier wafer comprises:
    providing a first carrier substrate;
    providing a second carrier substrate;
    etching the second carrier substrate to form the plurality of recesses; and
    attaching the second carrier substrate to a stop layer formed over the first carrier substrate with an adhesive.

13. The method of claim 1, wherein processing the back side of the imager wafer comprises forming terminal contacts and conductors on a back side of the imager wafer, and forming conductive vias in the imager wafer in electrical communication with the terminal contacts and conductors.

14. The method of claim 1, further comprising forming an encapsulate over the imager integrated circuits.

15. The method of claim 1, further comprising singulating, after attaching the imager wafer and carrier wafer with the lens wafer, the resulting imager and lens structures, into components.

16. The method of claim 3, wherein the step of processing a side of the first carrier wafer opposite the side containing the recesses to open the recesses further comprises one of grinding, chemical mechanical planarization (CMP), and etching a stop layer of the first carrier wafer.

17. The method of claim 4, wherein the step of processing a side of the first carrier wafer opposite the side containing the recesses to open the recesses further comprises one of grinding, chemical mechanical planarization (CMP), and etching a stop layer of the first carrier wafer.

18. The method of claim 1, wherein the step of processing the back side of the imager wafer includes connecting a stop layer to ground connections on the back side of the imager wafer.

19. The method of claim 11, wherein voids are left in the polymer adhesive to place a conductive via between a stop layer of the first carrier wafer and a connection on the back side of the imager wafer.

20. The method of claim 14, further comprising removing the encapsulant from over the imager integrated circuits using one of photo develop, wet solvent strip or plasma cleans before attaching the lens wafer.

21. A method of fabricating a semiconductor component comprising:
    providing an imager wafer comprising a plurality of dies of radiation sensitive integrated circuits, each having a plurality of image sensors;
    providing a carrier wafer having a plurality of recesses and including at least a carrier substrate and a stop layer;
    attaching the carrier wafer to the imager wafer with the recesses aligned with the image sensors;
    processing the imager wafer with the carrier wafer supporting the imager wafer;
    forming the carrier wafer into a plurality of lens support structures on the imager wafer, each lens support structure comprising a recess, each die of the imager wafer having an associated lens support structure surrounding the integrated circuits and having a height on the imager wafer; and
    attaching a lens wafer comprising a plurality of lens structures to the lens support structures with the lens structures of the lens wafer aligned with the recesses of the lens support structures. the lens support structure with the lens structure of the lens wafer aligned with said recesses.

22. The method of claim 21, wherein the step of forming the carrier wafer into lens support structures includes processing the carrier wafer to open the recesses.

23. The method of claim 21, wherein the carrier comprises glass and the step of forming the carrier wafer into the lens support structures comprises at least one of etching, grinding and planarizing the carrier.

24. The method of claim 21, wherein the forming the carrier wafer into the lens support structures step comprises at least one of etching, grinding and planarizing the carrier wafer.

25. The method of claim 21, wherein the step of forming the carrier wafer into the lens support structures comprises providing the carrier wafer with prefabricated recesses and then thinning the carrier wafer to expose the recesses.

26. The method of claim 21, wherein the processing step comprises one of grinding, chemical mechanical planarization (CMP), and etching to thin the imager wafer.

27. The method of claim 21, wherein the stop layer is etched, ground or planarized to expose the recesses.

* * * * *

UNITED STATES PATENT AND TRADEMARK OFFICE
CERTIFICATE OF CORRECTION

PATENT NO. : 8,048,708 B2  
APPLICATION NO. : 12/213836  
DATED : November 1, 2011  
INVENTOR(S) : Swarnal Borthakur et al.

Page 1 of 1

It is certified that error appears in the above-identified patent and that said Letters Patent is hereby corrected as shown below:

On the Title Page, Item (56), under "Other Publications", line 1, delete "Imgae" and insert -- Image --, therefor.

In column 10, lines 37-39, in Claim 21, delete "structures. the lens support structure with the lens structure of the lens wafer aligned with said recesses." and insert -- structures. --, therefor.

In column 10, line 49, in Claim 24, after "structures" delete "step".

Signed and Sealed this  
Tenth Day of January, 2012

David J. Kappos  
*Director of the United States Patent and Trademark Office*